United States Patent
Nakase et al.

(10) Patent No.: US 7,215,020 B2
(45) Date of Patent: May 8, 2007

(54) SEMICONDUCTOR DEVICE HAVING METAL PLATES AND SEMICONDUCTOR CHIP

(75) Inventors: Yoshimi Nakase, Anjo (JP); Yoshitsugu Sakamoto, Toyohashi (JP)

(73) Assignee: DENSO Corporation, Kariya (JP)

(*) Notice: Subject to any disclaimer, the term of this patent is extended or adjusted under 35 U.S.C. 154(b) by 0 days.

(21) Appl. No.: 10/972,475

(22) Filed: Oct. 26, 2004

(65) Prior Publication Data
US 2005/0093131 A1 May 5, 2005

(30) Foreign Application Priority Data
Oct. 29, 2003 (JP) ............................ 2003-368347

(51) Int. Cl.
*H01L 23/10* (2006.01)
*H01L 23/34* (2006.01)

(52) U.S. Cl. ............... 257/706; 257/707; 257/719
(58) Field of Classification Search ............ 257/706, 257/707, 719
See application file for complete search history.

(56) References Cited

U.S. PATENT DOCUMENTS

| | | | | |
|---|---|---|---|---|
| 5,471,366 A | * | 11/1995 | Ozawa | .......... 361/704 |
| 5,786,635 A | * | 7/1998 | Alcoe et al. | .......... 257/718 |
| 6,208,156 B1 | * | 3/2001 | Hembree | .......... 324/755 |
| 6,773,963 B2 | * | 8/2004 | Houle | .......... 438/122 |
| 6,791,181 B2 | * | 9/2004 | Horie et al. | .......... 257/706 |
| 2003/0022464 A1 | | 1/2003 | Hirano et al. | |

FOREIGN PATENT DOCUMENTS

| JP | A-S58-182256 | | 10/1983 |
|---|---|---|---|
| JP | 4066006949 | * | 1/1994 |
| JP | A-H07-226422 | | 9/1995 |

OTHER PUBLICATIONS

First Office Action from Chinese Patent Office issued on Aug. 11, 2006 for the corresponding Chinese patent application No. 200410087755.6 (a copy and English translation theerof).

* cited by examiner

*Primary Examiner*—Douglas W. Owens
*Assistant Examiner*—Samuel A Gebremariam
(74) *Attorney, Agent, or Firm*—Posz Law Group, PLC

(57) ABSTRACT

A semiconductor device includes: a semiconductor chip; a first metal plate disposed on one side of the chip through a first solder layer; a second metal plate disposed on the other side of the chip through a second solder layer; a third metal plate disposed on the second metal plate through a third solder layer; supporting means for holding at least one of distances between the chip and the first metal plate and between the chip and the second metal plate; and excess solder accommodation means for accommodating excess solder in a case where the third solder layer includes the excess solder.

8 Claims, 1 Drawing Sheet

SEMICONDUCTOR DEVICE HAVING METAL PLATES AND SEMICONDUCTOR CHIP

CROSS REFERENCE TO RELATED APPLICATION

This application is based on Japanese Patent Application No. 2003-368347 filed on Oct. 29, 2003, the disclosure of which is incorporated herein by reference.

FIELD OF THE INVENTION

The present invention relates to a semiconductor device having the first metal plate, a semiconductor chip, the second and the third metal plates, which are laminated in this order.

BACKGROUND OF THE INVENTION

A semiconductor device having a semiconductor chip and the first to third metal layers, i.e., plates, is disclosed in Japanese Patent Application Publication No. 2003-110064. The first metal layer is bonded to the semiconductor chip through the first solder layer so that the first metal layer works as an electrode and a heat radiation plate. The second metal layer is bonded to the semiconductor chip through the second solder layer, and the second metal layer is disposed opposite to the first metal layer. The third metal layer is bonded to the second metal layer through the third solder layer, and is disposed opposite to the semiconductor chip. Thus, in the device, the first to third solder layers are disposed between the first metal layer and the semiconductor chip, between the chip and the second metal layer, and between the second and third metal layers, respectively. The first to third solder layers are formed in such a manner that a solder foil is sandwiched therebetween, and then, the solder foil is heated up to melting point of the solder. Thus, the solder foil is melted so that two parts are bonded together with the solder.

However, in each solder layer, the supplied amount of the solder foil is in short or excess. This is because variations of dimensions of the semiconductor chip and/or the metal layers may cause excess or deficiency of the solder. Specifically, the volume of the solder foil may be in short or excess. When the volume of the solder is excess, the excess solder overflows so that the excess solder is adhered to other parts of the device such as a wire. Thus, an electric circuit may be short. Thus, the excess solder adheres to the other parts so that a solder bridge is formed. Accordingly, the device may be damaged. On the other hand, when the volume of the solder is in short, the thickness of the solder layer is not sufficient. Therefore, reliability of bonding is reduced. Further, heat radiation performance is also reduced.

SUMMARY OF THE INVENTION

In view of the above-described problem, it is an object of the present invention to provide a semiconductor device having the first metal plate, a semiconductor chip, the second and third metal plates, which are laminated in this order with solder layers. Specifically, the thickness of each solder layer is sufficiently secured so that each part in the device is strongly bonded together.

A semiconductor device includes: a semiconductor chip; a first metal plate disposed on one side of the chip through a first solder layer; a second metal plate disposed on the other side of the chip through a second solder layer; a third metal plate disposed on the second metal plate through a third solder layer; supporting means for holding at least one of distances between the chip and the first metal plate and between the chip and the second metal plate; and excess solder accommodation means for accommodating excess solder in a case where the third solder layer includes the excess solder.

In the above device, the thickness of each solder layer is sufficiently secured so that each part in the device is strongly bonded together. Specifically, the thickness of each solder layer can be controlled appropriately by the supporting means. Further, the variations of each part composing the device can be compensated so that the dimensions of the device can be controlled appropriately.

Preferably, the supporting means is disposed between the chip and the first metal plate and between the chip and the second metal plate so that each distance between the chip and the first metal plate and between the chip and the second metal plate is set to be a predetermined distance. More preferably, the predetermined distance is defined by dimensions of the supporting means.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment)

Figure 1:
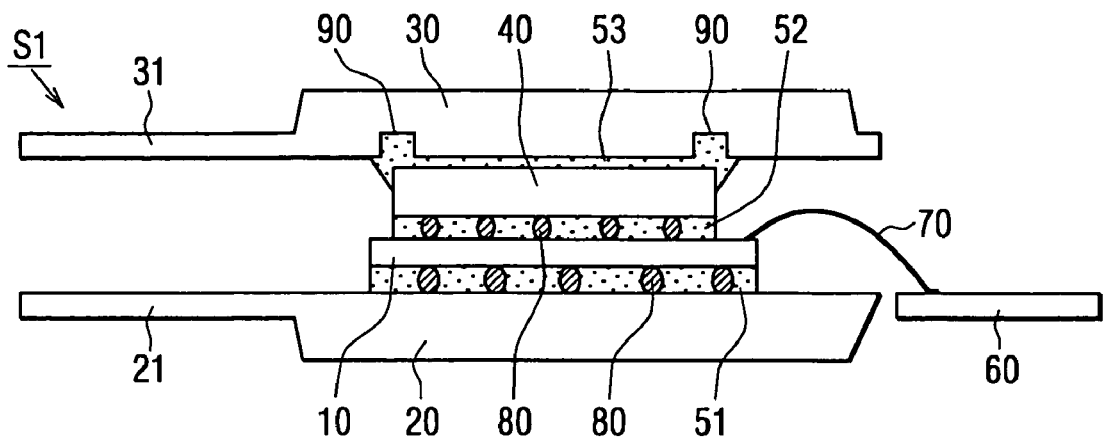
FIG. 1 is a cross sectional view showing a semiconductor device according to a first embodiment of the present invention.

A semiconductor device S1 according to a first embodiment of the present invention is shown in FIG. 1. The device S1 includes a semiconductor chip 10, a lower heat sink 20 as the first metal layer, a heat sink block 40 as the second metal layer, and an upper heat sink 30 as the third metal layer. The first to third solder layers 51–53 are disposed and bonds between the lower heat sink 20 and the chip 10, between the chip 10 and the heat sink block 40, and between the heat sink block 40 and the upper heat sink 30, respectively.

The heat generated in the chip 10 is radiated from an upper side of the chip 10 through the second solder layer 52, the heat sink block 40, the third solder layer 53 and the upper heat sink 30. The heat generated in the chip 10 is also radiated from a lower side of the chip 10 through the first solder layer 51 and the lower heat sink 20. The chip 10 is, for example, a power device such as an IGBT (i.e., insulated gate bipolar transistor) or a thyristor. However, the chip 10 can include other electric parts.

The shape of the chip 10 is, for example, a rectangular shaped thin plate. Further, the lower and upper heat sinks 20, 30 and the heat sink block 40 are made of metal having good electric conductivity and heat conductivity. For example, they are made of copper alloy or aluminum alloy. Here, the heat sink block 40 can be made of iron alloy. The lower and upper heat sinks 20, 30 are electrically connected to electrodes of the chip 10 such as a collector electrode and an emitter electrode through the solder layers 51–53 and the heat sink block 40. The lower heat sink 20 has a rectangular plate shape. Specifically, the lower heat sink 20 is formed from a metal plate so that the lower heat sink 20 works as the first metal plate, i.e., the first metal layer. A lower terminal 21 is protruded from the lower heat sink 20 toward left side of the chip 10 shown in FIG. 1. The heat sink block 40 is a little smaller than the chip 10, and has a rectangular plate shape. Specifically, the heat sink block 40 is formed from a metal plate so that the heat sink block 40 works as the second metal plate, i.e., the second metal layer. The upper heat sink 30 has a rectangular plate shape. Specifically, the upper heat sink 30 is formed from a metal plate so that the upper heat sink 30 works as the third metal plate, i.e., the third metal layer. An upper terminal 31 is protruded from the upper heat sink 30 toward left side of the chip 10 shown in FIG. 1.

The upper and lower terminals 21, 31 of the upper and lower heat sinks 20, 30 connect between the chip 10 and an external circuit. Thus, the upper and lower heat sinks 20, 30 work as an electrode and a heat radiation plate so that the heat sinks 20, 30 radiate heat generated in the chip 10 and the heat sinks 20, 30 connect between the chip 10 and the external circuit.

A lead frame 60 as a signal lead is disposed around the chip 10. The chip 10 and the lead frame 60 are electrically connected with a wire 70. The wire 70 is formed by a wire bonding method. The wire 70 is made of gold or aluminum. In the device S1, supporting means 80 is disposed between the chip 10 and the lower heat sink 20, and between the chip 10 and the heat sink block 40. The supporting means 80 holds a distance therebetween to be constant. Further, excess solder accommodation means 90 is disposed on the upper heat sink 30. The excess solder accommodation means 90 accommodates excess solder, which overflows from the third solder layer 53.

The supporting means 80 is made of metallic ball 80, which is preliminarily embedded in the first and second solder layers 51, 52. Although the supporting means 80 is disposed between the chip 10 and the lower heat sink 20 and disposed between the chip 10 and the heat sink block 40, the supporting means 80 can be disposed at least one of spaces between the chip 10 and the lower heat sink 20 and between the chip 10 and the heat sink block 40. In this case, the metallic ball as the supporting means 80 is embedded at least one of the solder layers 51, 52. The metallic ball 80 is preferably made of material having high heat resistance and appropriate workability. For example, the metallic ball 80 is made of metallic particle such as nickel and copper. The metallic ball 80 can be formed of coated ceramic ball, the surface of which is coated by a plating method. Preferably, the metallic ball 80 has high melting point higher than that of the solder layers 51–53.

The excess solder accommodation means 90 is a groove 90 formed on the surface of the upper heat sink 30. Specifically, the groove 90 is disposed on a portion of the upper heat sink 30 corresponding to the outer circumference of the heat sink block 40. The groove 90 is formed by a press work method or a cutting work method. The cross section of the groove 90 is a square. However, the cross section of the groove 90 can be another shape such as a V-shape or an U-shape. The groove 90 is formed to be a continuous ring shaped groove so that the groove 90 corresponds to the whole outer circumference of the heat sink block 40. However, the groove 90 can be a discrete ring shaped groove.

Next, the semiconductor device S1 is manufacture as follows. Firstly, the chip 10 is bonded on the lower heat sink 20 through the first solder layer 51 by a soldering method. Then, the heat sink block 40 is also bonded to the chip 10 through the second solder layer 52 by the soldering method. In this case, the chip 10 is laminated on the surface of the lower heat sink 20 through a solder foil including the metallic ball 80 as the supporting means. Further, the heat sink block 40 is laminated on the chip 10 through the solder foil including the metallic ball 80. The metallic ball 80 is uniformly disposed on the solder foil. To prepare the solder foil including the metallic ball 80, the metallic ball 80 is mixed in a solder paste so that the solder paste is formed into a solder foil with the metallic ball 80. Or the metallic ball 80 is preliminarily scattered on the solder foil so that the solder foil including the metallic ball 80 is formed. Further, the metallic ball 80 is preliminarily scattered on one of the solder foils, and then, the other solder foil is laminated on the one solder foil with the metallic ball 80 so that the solder foil including the metallic ball 80 is formed.

After that, the solder foil is heated by a heater (i.e., reflow equipment) up to a melting point of the solder so that the solder foil is melted. Then, the melted solder foil is cooled and hardened. When the melted solder foil is hardened, the first solder layer 51 and the second solder layer 52 are formed. Here, the thickness of the first or second solder layer 51, 52 is defined by the dimensions of the metallic ball 80. Thus, the chip 10 and the lower heat sink 20 are bonded with the first solder layer 51, and the chip 10 and the heat sink block 40 are bonded with the second solder layer 52.

Then, a signal terminal of the chip 10 such as a gate pad and the lead frame 60 are bonded by the wire bonding method so that the signal terminal and the lead frame 60 are bonded and electrically connected with the wire 70. Then, the upper heat sink 30 is bonded on the heat sink block 40 by the soldering method. In this case, the upper heat sink 30 is laminated on the heat sink block 40 through the solder foil, and then, the solder foil is heated and melted by the heater. Then, the melted solder foil is cooled and hardened. Here, the amount of the solder foil is supplied excessively, which is larger than the required amount of the solder foil. This is because variations of each part of the device S1 are compensated by a space between the heat sink block 40 and the upper heat sink 30. Therefore, even when the dimensions of the part become smaller, the shortage of amount of the solder does not occur since the amount of the solder excessively exists. When the dimensions of the part become larger, the excess of amount of the solder occurs. However, to prevent from shorting circuit, the excess solder accommodation means 90 as the groove 90 is formed on the upper heat sink 30. Accordingly, the excess solder flows into the groove 90 so that the excess solder does not flow out. Thus, the circuit is prevented from shorting. This is, no solder bridge is generated.

The melted solder foil is hardened so that the upper heat sink 30 and the heat sink block 40 are bonded with the third solder layer 53. The lower heat sink 20, the semiconductor chip 10, the heat sink block 40 and the upper heat sink 30 are bonded and electrically connected with the solder layers 51–53. Further, they are thermally connected with the solder layers 51–53. Thus, the semiconductor device S1 is completed.

Here, the device S1 has the following characteristics. The device S1 includes the metallic ball 80 as the supporting means for holding a predetermined distance between the chip 10 and the lower heat sink 20 and/or between the chip 10 and the heat sink block 40. Thus, the thickness of the first or the second solder layer 51, 52, is secured to be an appropriate thickness by the metallic ball 80. Further, the groove 90 as the excess solder accommodation means is formed on the upper heat sink 30. The groove 90 accommodates the excess solder from the third solder layer 53. Therefore, even when the amount of the solder is excess, the excess solder, which is melted and flown from the third solder layer 53, flows into the groove 90 so that the excess solder does not flow out. The dimensions of the device S1 in the thickness direction can be adjusted by the thickness of the third solder layer 53. The amount of the third solder layer 53 can be increased excessively, so that the degree of freedom of the thickness of the third solder layer 53 is improved. Thus, by controlling the thickness of the third solder layer 53, the total dimensions of the device S1 can be controlled appropriately. Specifically, manufacturing variations of dimensions of the parts composing the device S1 can be compensated by the space between the heat sink block 40 and the upper heat sink 30. Here, the manufacturing variations of the parts is, for example, the variations of the thickness of the chip 10, the variations of the thickness of the heat sinks 20, 30, and the heat sink block 40, or the variations of the thickness of the first and second solder layers 51, 52.

Thus, the thickness of the first and second solder layers 51, 52 can be controlled appropriately so that the reliability of the device S1 is improved. Further, the excess solder can be accommodated in the groove 90 so that the short circuit is prevented from generating. Furthermore, the thermal radiation performance of the device S1 is improved.

Here, the reason why the groove 90 is formed on the upper heat sink 30 is such that the third solder layer 53 is disposed separately from the chip 10. Thus, the third solder layer 53 does not contact the chip 10. Therefore, even if the excess solder flows out from the groove 90, it is difficult for the excess solder to adhere to the chip 10. The first and second solder layers 51, 52, which contact the chip 10, are necessitated to prevent from supplying excess solder. Therefore, to hold the thickness of the solder layers 51, 52 by the metallic ball 80 is effective means for preventing from the solder bridge.

Thus, the thickness of each solder layer 51–53 can be controlled appropriately. Further, the variations of each part composing the device S1 can be compensated so that the dimensions of the device S1 can be controlled appropriately.

Although the device S1 is not sealed, the device S1 can be sealed with resin mold. In this case, the device S1 is molded with epoxy resin by a transfer molding method. Further, in this case, the lower surface of the lower heat sink 20 and the upper surface of the upper heat sink 30 are exposed from the resin mold so that the heat radiation performance is improved.

(Second Embodiment)

Figure 2:
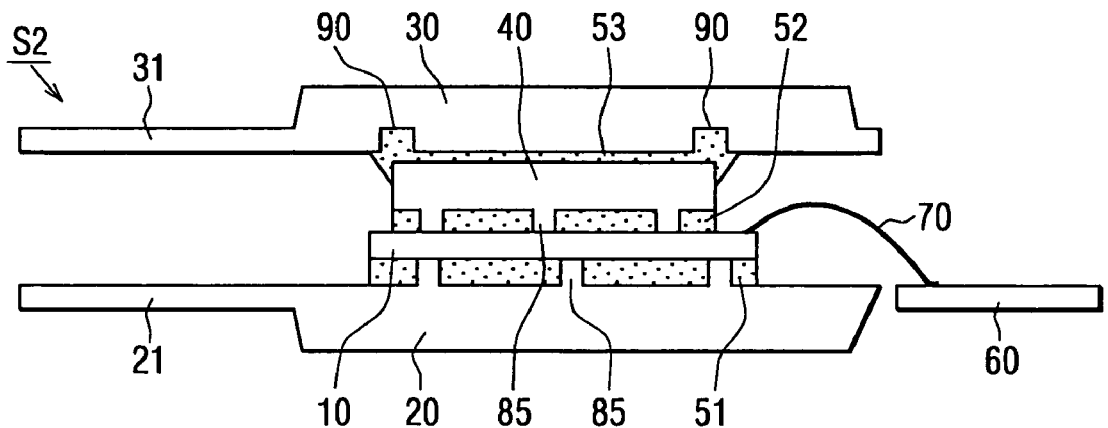
FIG. 2 is a cross sectional view showing a semiconductor device according to a second embodiment of the present invention.

A semiconductor device S2 according to a second embodiment of the present invention is shown in FIG. 2. The device S2 includes a supporting means 85, which is a protrusion 85 protruded from the lower heat sink 20 and the heat sink block 40. The protrusion 85 protrudes toward the chip 10. Although both of the lower heat sink 20 and the heat sink block 40 include the protrusion 85, at least one of the lower heat sink 20 and the heat sink block 40 can include the protrusion 85. When the protrusion 85 is disposed between the chip 10 and the lower heat sink 20, the protrusion 85 is formed on the lower heat sink 20. When the protrusion 85 is disposed between the chip 10 and the heats ink block 40, the protrusion 85 is formed on the heat sink block 40.

In FIG. 2, the protrusion 85 is formed on the upper surface of the lower heat sink 20, and on the lower surface of the heat sink block 40. The protrusion 85 is formed by the press work method or the cutting work method. The device S2 can be manufactured by the similar method for manufacturing the device S1. In this case, the solder foils without the metallic ball 80 are used for the first and second solder layers 51, 52. In the device S2, the thickness of the first and second solder layers 51, 52 are controlled appropriately by the protrusion 85. Further, the device S2 includes the groove 90.

Thus, the thickness of each solder layer 51–53 can be controlled appropriately. Further, the variations of each part composing the device S2 can be compensated so that the dimensions of the device S2 can be controlled appropriately.

Although the supporting means 80 is the protrusion 85 in the device S2 or the metallic ball 80 in the device S1, the supporting means can be another part as long as the supporting means holds the distance between the chip 10 and the lower heat sink 20 and/or the distance between the chip 10 and the heat sink block 40.

Although the excess solder accommodation means 90 is the groove 90, the excess solder accommodation means 90 can be another part as long as the excess solder accommodation means 90 accommodates the excess solder.

(Third Embodiment)

Figure 3:
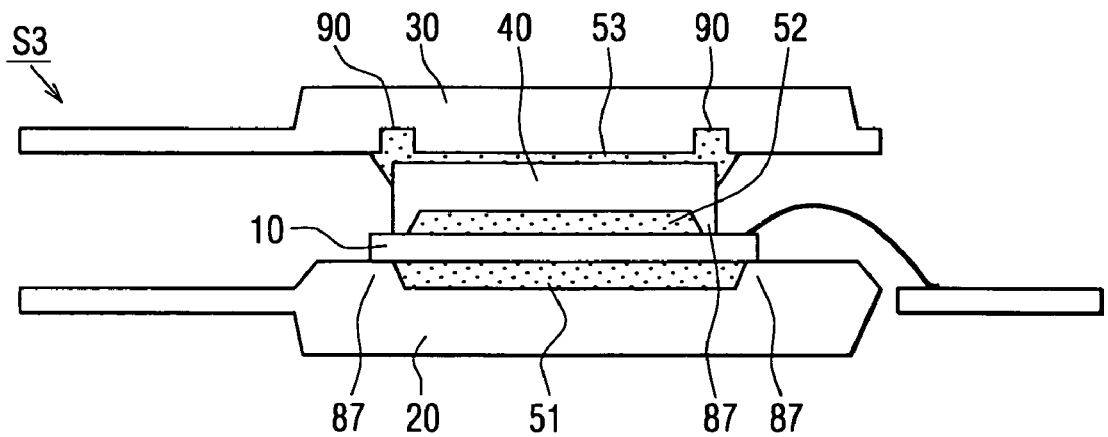
FIG. 3 is a cross sectional view showing a semiconductor device according to a third embodiment of the present invention.

A semiconductor device S3 according to a third embodiment of the present invention is shown in FIG. 3. The device S3 includes a supporting means 87, which has a concavity on the surface of the lower heat sink 20 or the heat sink block 40. The first and second solder layers 51, 52 are disposed in the concavities so that the thicknesses of the first and second solder layers 51, 52 are controlled appropriately.

Thus, the thickness of each solder layer 51–53 can be controlled appropriately. Further, the variations of each part composing the device S3 can be compensated so that the dimensions of the device S3 can be controlled appropriately.

Such changes and modifications are to be understood as being within the scope of the present invention as defined by the appended claims.

What is claimed is:

1. A semiconductor device comprising:
   a semiconductor chip;
   a first metal plate disposed on a first side of the chip through a first solder layer;
   a second metal plate disposed on a second side of the chip through a second solder layer, wherein the first side of the chip is opposite to the second side of the chip;
   a third metal plate disposed on the second metal plate through a third solder layer;
   supporting means for holding at least one of distances between the chip and the first metal plate and between the chip and the second metal plate; and
   excess solder accommodation means for accommodating excess solder in a case where the third solder layer includes the excess solder, wherein
   the excess solder accommodation means is disposed in the third metal plate, and
   the excess solder accommodation means is a groove, which is disposed on a part of the third metal plate, and wherein the pan of the third metal plate corresponds to a peripheral edge of the second metal plate.

2. The device according to claim 1, wherein the supporting means is a metal ball, which is disposed in the first and second solder layers.

3. The device according to claim 1, wherein the supporting means is a ceramic ball, which is coated with metal.

4. The device according to claim 1, wherein the supporting means is disposed between the chip and the first metal plate and between the chip and the second metal plate so that each distance between the chip and the first metal plate and between the chip and the second metal plate is set to be a predetermined distance.

5. The device according to claim 4, wherein the predetermined distance is defined by dimensions of the supporting means.

6. The device according to claim 1, wherein the supporting means is a protrusion, which protrudes from the first and second metal plates toward the chip.

7. The device according to claim 6,
wherein the protrusion is disposed between the chip and the first metal plate and between the chip and the second metal plate so that each distance between the chip and the first metal plate and between the chip and the second metal plate is set to be a predetermined distance, and
wherein the predetermined distance is defined by dimensions of the protrusion.

8. The device according to claim 1,
wherein the first metal plate is an electrode and a heat radiation plate so that the first metal plate connects between the chip and an external circuit and the first metal plate radiates heat generated in the chip, and
wherein the third metal plate is an electrode and a heat radiation plate so that the third metal plate connects between the chip and an external circuit and the third metal plate radiates heat generated in the chip.

* * * * *